(12) United States Patent
Honda et al.

(10) Patent No.: US 9,087,794 B2
(45) Date of Patent: Jul. 21, 2015

(54) MANUFACTURING METHOD OF MOLDED PACKAGE

(75) Inventors: Masahiro Honda, Okazaki (JP);
Koutarou Andou, Nukata-gun (JP);
Shinpei Taga, Nishio (JP)

(73) Assignee: DENSO CORPORATION, Kariya (JP)

( * ) Notice: Subject to any disclaimer, the term of this patent is extended or adjusted under 35 U.S.C. 154(b) by 321 days.

(21) Appl. No.: 13/537,314

(22) Filed: Jun. 29, 2012

(65) Prior Publication Data

US 2013/0011970 A1 Jan. 10, 2013

(30) Foreign Application Priority Data

Jul. 5, 2011 (JP) ................................. 2011-149058

(51) Int. Cl.
*H01L 21/44* (2006.01)
*H01L 23/31* (2006.01)
*G01L 19/14* (2006.01)
*H01L 21/56* (2006.01)

(52) U.S. Cl.
CPC .......... *H01L 23/3107* (2013.01); *G01L 19/141* (2013.01); *G01L 19/148* (2013.01); *H01L 21/565* (2013.01); *H01L 2224/16145* (2013.01); *H01L 2224/32245* (2013.01); *H01L 2224/48137* (2013.01); *H01L 2224/48247* (2013.01); *H01L 2224/73265* (2013.01); *H01L 2224/92247* (2013.01)

(58) Field of Classification Search
CPC .......... H01L 2224/32245; H01L 2224/48247; H01L 23/3107; H01L 21/565; H01L 2224/92247; H01L 2224/16145; H01L 2224/48137; H01L 2224/73265; H01L 2924/00

USPC .................. 438/118, 415, 680, 51, 64, 67
See application file for complete search history.

(56) References Cited

U.S. PATENT DOCUMENTS

| | | | | |
|---|---|---|---|---|
| 5,396,795 | A * | 3/1995 | Araki | 73/204.26 |
| 5,444,286 | A | 8/1995 | Ichihashi | |
| 7,219,544 | B2 * | 5/2007 | Tanaka et al. | 73/204.26 |
| 7,644,615 | B2 * | 1/2010 | Arisaka | 73/335.04 |
| 2006/0001116 | A1 * | 1/2006 | Auburger et al. | 257/433 |
| 2006/0075815 | A1 | 4/2006 | Tanaka et al. | |
| 2007/0022808 | A1 | 2/2007 | Tanaka et al. | |
| 2008/0148842 | A1 * | 6/2008 | Oda | 73/204.26 |
| 2009/0072333 | A1 * | 3/2009 | Haag et al. | 257/415 |
| 2009/0199632 | A1 | 8/2009 | Toyoda | |
| 2010/0133631 | A1 * | 6/2010 | Benzel | 257/417 |

FOREIGN PATENT DOCUMENTS

| | | |
|---|---|---|
| JP | A-2001-235356 | 8/2001 |
| JP | A-2010-101688 | 5/2010 |

* cited by examiner

*Primary Examiner* — William F Kraig
*Assistant Examiner* — Nga Doan
(74) *Attorney, Agent, or Firm* — Posz Law Group, PLC (57) ABSTRACT

In a manufacturing method of a molded package, a lead frame including an island portion and a support portion is prepared. A circuit chip is mounted on the island portion, and the sensor chip is arranged such that a first end section having an electric connecting portion is adjacent to the circuit chip and a second end section having a sensing portion is supported by the support portion. The circuit chip and the electric connecting portion of the first end section is electrically connected through a connection member. The circuit chip, the island portion, the connection member and the first end section are sealed with a resin while maintaining the support state. After the sealing, the support portion is cut from the lead frame and separated from the second end section.

15 Claims, 12 Drawing Sheets

MANUFACTURING METHOD OF MOLDED PACKAGE

CROSS REFERENCE TO RELATED APPLICATION

This application is based on Japanese Patent Application No. 2011-149058 filed on Jul. 5, 2011, the disclosure of which is incorporated herein by reference.

TECHNICAL FIELD

The present disclosure relates to a manufacturing method of a molded package that supports an end section of a sensor chip with a molded resin.

BACKGROUND

A molded package that supports an end section of a sensor chip with a molded resin is, for example, described in JP2009-505088A, which corresponds to US2009/0072333A1. The described molded package is manufactured by the following method.

First, a circuit chip, a sensor chip and a lead frame are prepared. The sensor chip has an electric connecting portion to be electrically connected to the circuit chip at a first end section and a sensing portion at a second end section. The lead frame has an island portion for disposing the circuit chip thereon.

Next, the circuit chip is mounted on the island portion, and the first end of the sensor chip is placed adjacent to the circuit chip. Further, the electric connecting portion of the sensor chip is electrically connected to the circuit chip through a connection member, such as bonding wires.

Thereafter, the island portion, the circuit chip, the connection member and the first end section of the sensor chip sealed with a resin, and the second end section of the sensor chip is projected from the sealing resin.

In such a molded package, the second end section of the sensor chip is projected from the sealing resin to enable the sensing portion to perform an accurate sensing operation.

SUMMARY

According to an aspect of the present disclosure, in a method of manufacturing a molded package, firstly, a circuit chip, a sensor chip and a lead frame are prepared. The sensor chip has an electric connecting portion at a first end section thereof and a sensing portion at a second end section thereof. The lead frame has an island portion and a support portion. Next, the circuit chip is mounted on the island portion. The sensor chip is arranged such that the first end section is adjacent to the circuit chip and the second end section is supported by the support portion. The electric connecting portion of the sensor chip and the circuit chip are electrically connected through a connection member. Then, the island portion, the circuit chip, the connection member and the first end section of the sensor chip are sealed with a resin while maintaining the state where the second end section is supported by the support portion. After the sealing, the support portion is cut from the lead frame, and separated from the second end section.

In the above described method, before the sealing, while the first end section of the sensor chip is electrically connected to the circuit chip through the connection member, the second end section of the sensor chip is supported by the support portion. Namely, before the sealing, since the sensor chip is held steady, a work piece can be easily handled. Therefore, a separation or the like around the first end section of the sensor chip can be reduced, and hence damage to the connection member electrically connecting the circuit chip and the sensor chip can be reduced.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Hereinafter, exemplary embodiments of the present disclosure will be described with reference to the drawings. Like parts are designated with like reference numbers throughout the embodiments, and a description thereof will not be repeated.

First Embodiment

Figure 1:
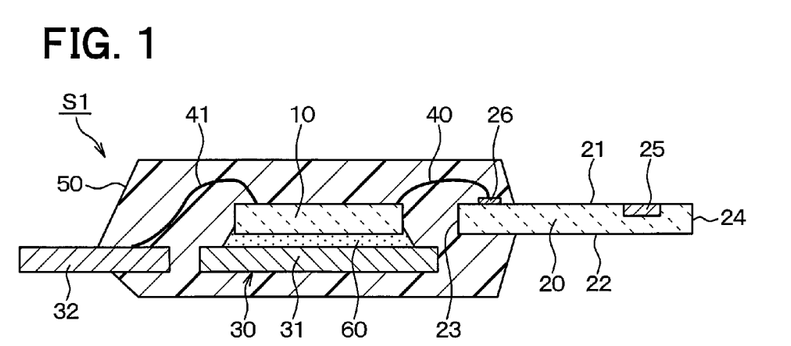
FIG. 1 is a diagram illustrating a schematic cross-sectional view of a molded package according to a first embodiment.

Referring to FIG. 1, a molded package S1 according to a first embodiment generally includes a circuit chip 10, a sensor chip 20, a lead frame 30, bonding wires 40, and a molded resin 50. The lead frame 30 has an island portion 31 for disposing the circuit chip 10 thereon. The bonding wires 40 serve as connection members for electrically connecting between the circuit chip 10 and the sensor chip 20. The molded resin 50 seals the circuit chip 10, the island portion 31, the bonding wires 40 and at least a part of the sensor chip 20.

The circuit chip 10 is a general IC chip or the like. The circuit chip 10 is produced by a general semiconductor manufacturing process using a silicon semiconductor or the like. The circuit chip 10 is electrically connected to the sensor chip 20 to control the sensor chip 20 and the like.

The sensor chip 20 has a plate shape with a first surface 21 on one side and a second surface 22 on the other side. For example, the sensor chip 20 typically has a rectangular plate shape having a length in a right and left direction in FIG. 1. Hereinafter, the direction of the sensor chip 20 along the right and left direction in FIG. 1 is referred to as a lengthwise direction of the sensor chip 20.

The sensor chip 20 has a first end section 23 including a first end of the sensor chip 20 and a second end section 24 including a second end of the sensor chip 20 opposite to the first end in the lengthwise direction. The sensor chip 20 is arranged such that the first end section 23 is adjacent to the circuit chip 10, and the second end section 24 is further from the circuit chip 10.

The first end section 23 is disposed inside of the molded resin 50, that is, sealed with the molded resin 50. The second end section 24 is disposed outside of the molded resin 50. The second end section 24 is provided with a sensing portion 25.

The sensing portion 25 includes a membrane for detecting pressure or a flow rate of a fluid, a beam structure for detecting an acceleration or an angular velocity, or the like. For example, the sensing portion 25 is disposed at the first surface 21 of the sensor chip 20.

Pads 26 are disposed at the first surface 21 in the first end section 23. The pads 26 serve as electric connecting portions. The pads 26 are made of an aluminum or the like by a vapor deposition technique or a spattering technique. The sensor chip 20 is produced by a general semiconductor manufacturing process using a silicon semiconductor or the like.

The lead frame 30 includes the island portion 31 for supporting the circuit chip 10 mounted thereon, and lead portions 32 as terminals for allowing electric connection with an external device. The lead frame 30 is made of a metal having favorable electric conductivity, such as copper (Cu) or Iron 42. The lead frame 30 is made by etching, pressing and the like.

The island portion 31 has a plate shape with a size larger than the circuit chip 10. The circuit chip 10 is bonded to the island portion 31 through an electrically conductive or electrically insulating adhesive 60. The circuit chip 10 and the lead portions 32 are connected to each other through bonding wires 41 to be electrically connected to each other. The bonding wires 41 are for example made of gold or aluminum.

The circuit chip 10 and the pads 26 of the first end section 23 are connected to each other through the bonding wires 40 to be electrically connected to each other. The bonding wires 40 are for example made of gold or aluminum. The bonding wires 40 serve as the connection members. In other words, the sensor chip 20, the circuit chip 10 and the lead portions 32 are electrically connected to one another through the bonding wires 40, 41.

Further, the circuit chip 10, the sensor chip 20, the lead frame 30 and the bonding wires 40, 41 are sealed with the molded resin 50. The molded resin 50 is for example made of an epoxy resin, and is formed by a transfer molding technique using a die.

It is to be noted that the second end section 24 is projected out from the molded resin 50 to enable an accurate sensing operation at the sensing portion 25. Also, the lead frames 32 are partly projected out from the molded resin 50 to enable electric connection with an external device.

In the present embodiment, the second end section 24 is not in contact with the island portion 31, and is not supported by the island portion 31. The second end section 24 is spaced from the island portion 31 and that the sensor chip 20 is substantially supported only by the molded resin 50 as the first end section 23 is sealed within the molded resin 50.

Next, a manufacturing method of the molded package S1 will be described with reference to FIGS. 2, 3A, 3B, 3C, 4, 5A, 5B and 5C.

Figure 2:
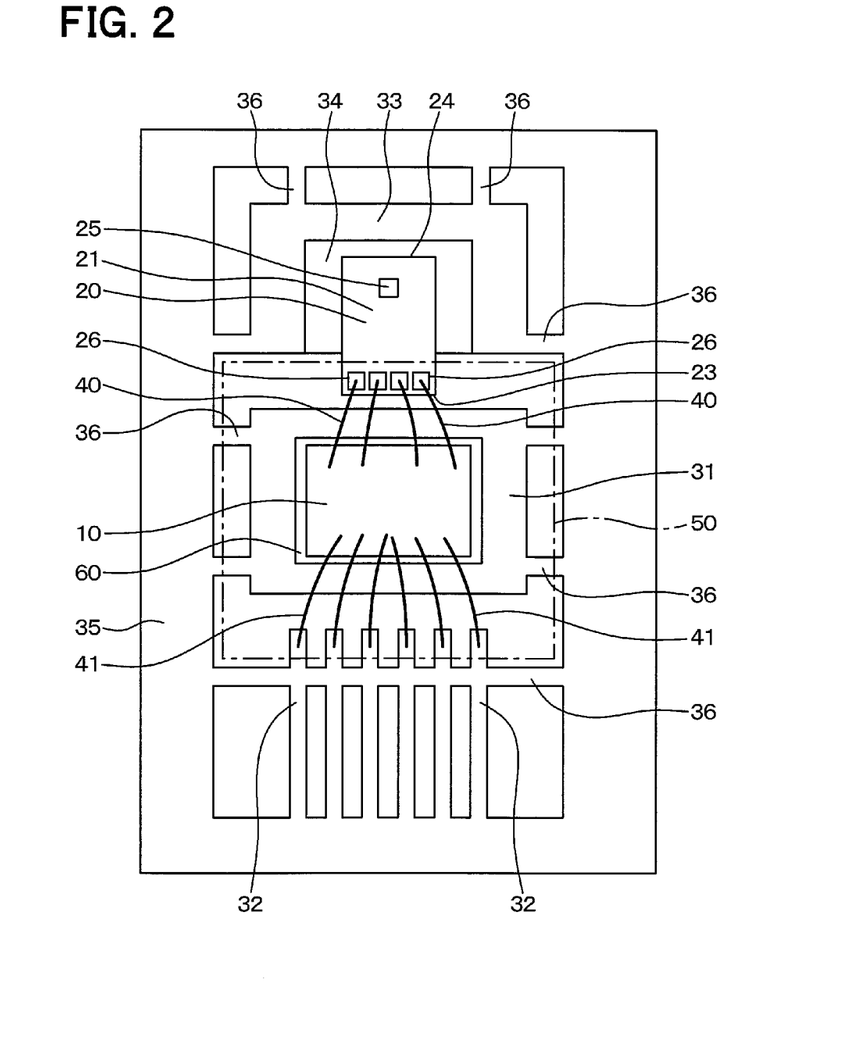
FIG. 2 is a diagram illustrating a schematic plan view of a lead frame of the molded package, to which a circuit chip and a sensor chip are attached, according to the first embodiment.
Figure 3A:
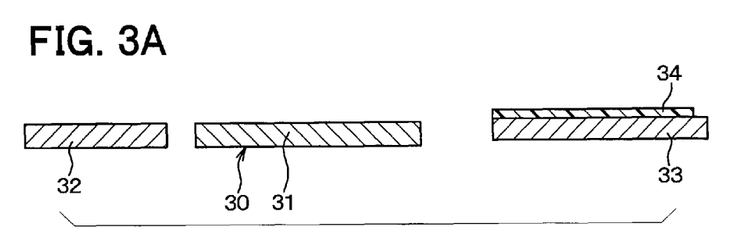
FIGS. 3A, 3B and 3C are diagrams illustrating schematic cross-sectional views of a work piece for explaining a first process and a second process of a manufacturing method of the molded package according to the first embodiment.
Figure 3B:
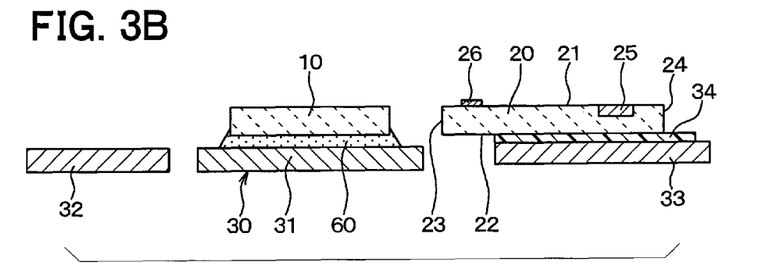
Figure 3C:
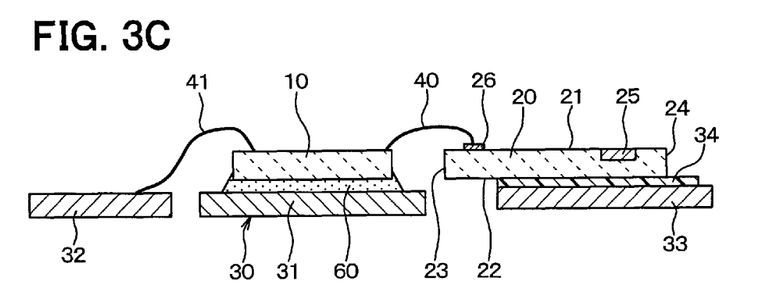

FIG. 2 is a diagram illustrating a schematic plan view of the lead frame 30 to which the chips 10, 20 are attached. FIG. 3A is a diagram illustrating a schematic cross-sectional view of a work piece for explaining a first process of the manufacturing method, and FIGS. 3B and 3C are diagrams illustrating schematic cross-sectional views of the work piece for explaining a second process of the manufacturing method.

Figure 4:
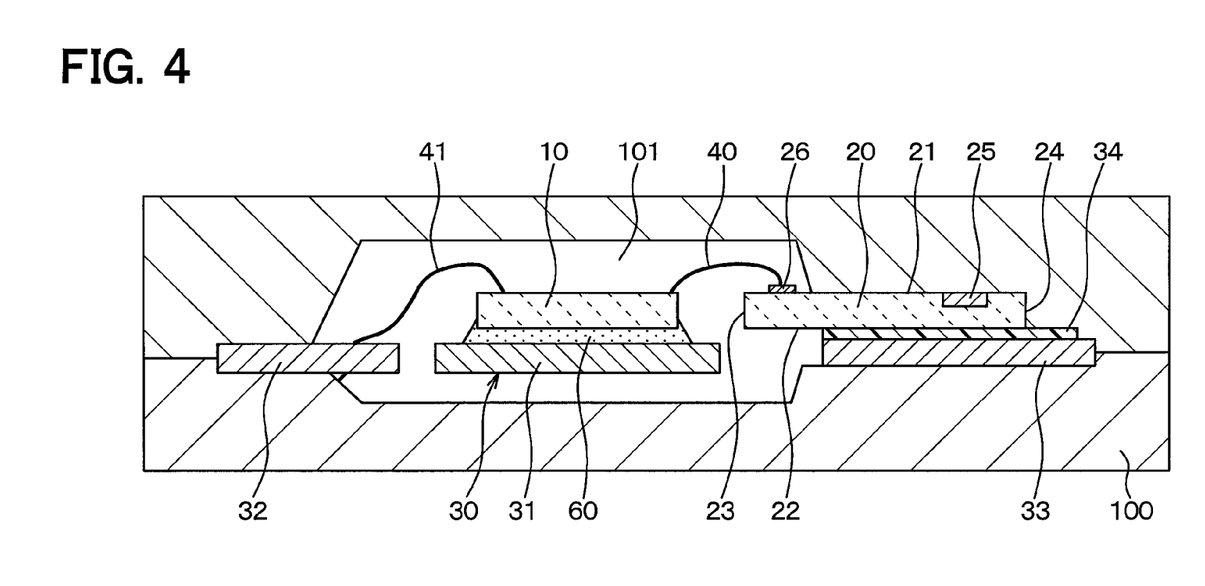
FIG. 4 is a diagram illustrating a schematic cross-sectional view of the lead frame disposed in a molding die with the circuit chip and the sensor chip for explaining a third process of the manufacturing method of the molded package according to the first embodiment.
Figure 5A:
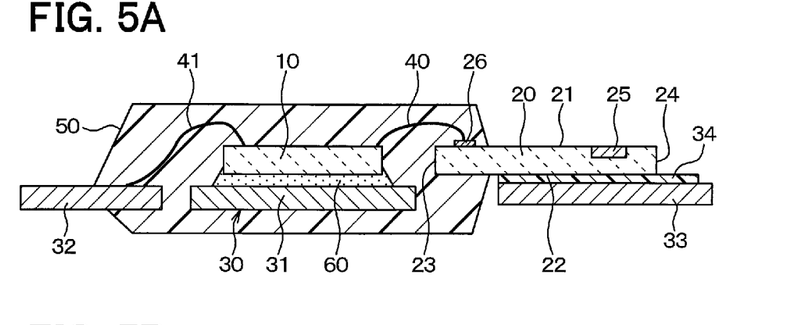
FIGS. 5A, 5B, and 5C are diagrams illustrating schematic cross-sectional views of the work piece for explaining the third process of the manufacturing method of the molded package according to the first embodiment.
Figure 5B:
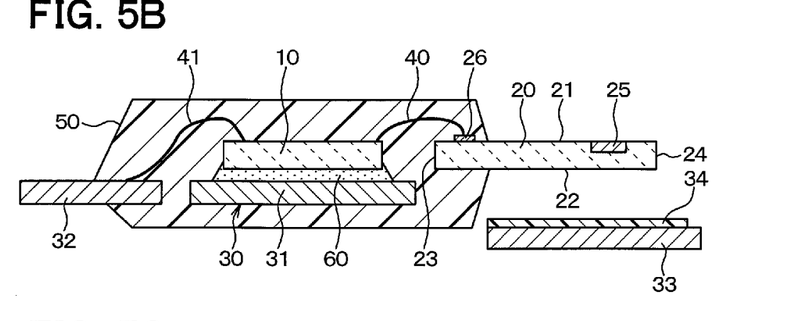
Figure 5C:
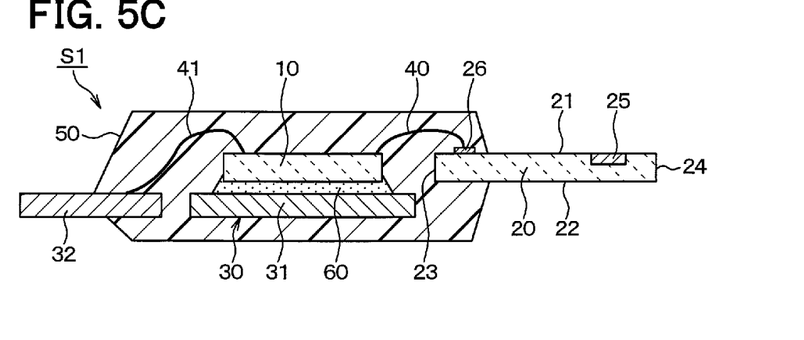

FIG. 4 is a diagram illustrating a schematic cross-sectional view of the lead frame 30 to which the chips 10, 20 are attached and is disposed in a die 100 for resin-molding. FIGS. 5A to 5C are diagrams illustrating schematic cross-sectional views of the work piece for explaining a third process of the manufacturing method. In FIGS. 5A to 5C, the die 100 is not illustrated.

As shown in FIGS. 2 and 3A, as the first process, the circuit chip 10, the sensor chip 20 having the pad 26 in the first end section 23 and the sensing portion 25 in the second end section 24, and the lead frame 30 having the island portion 31 and the lead portions 32 are prepared.

The lead frame 30 prepared in the first process has a support portion 33 for supporting the second end section 24. The support portion 33 is disposed at a position where the second end section 24 is to be placed so as to receive the second surface 22 of the second end section 24.

In this case, an adhesive film 34 is attached to a support surface of the support portion 33, which supports the sensor chip 20. The film 34 has an adherence property. The film 34 is provided by a shaped product of a polyimide resin, various kinds of foamed resin, a UV curable resin or the like.

When the sensor chip 20 is mounted on the lead frame 30, the second surface 22 of the second end section 24 is bonded to the support surface of the support portion 33 through the adhesive film 34.

The prepared lead frame 30 includes a frame portion 35 on a periphery of the island portion 31, the lead portions 32 and the support portion 33. The island portion 31, the lead portions 32 and the support portion 33 are connected to the frame portion 35 through tie bars 36. That is, the island portion 31, the lead portions 32 and the support portion 33 are integral with the frame portion 35 through the tie bard 36. In FIG. 2, a chain line denotes an outline of the molded resin 50 that is formed at last. After respective parts are sealed with the resin 50, that is, after the molded resin 50 is formed, the tie bars 36 located outside of the molded resin 50 are suitably cut off.

As shown in FIGS. 2, 3B and 3C, in the second process, the circuit chip 10 is mounted on the island portion 31. Also, the sensor chip 20 is arranged such that the first end section 23 is adjacent to the circuit chip 10, and the pads 26 and the circuit chip 10 are electrically connected to each other through the bonding wire 40.

In this case, the second end section 24 is supported on the support portion 33. Namely, the sensor chip 20 is only in contact with the support portion 33 through the film 34, excluding the bonding wires 40, and is supported only by the support portion 33.

Specifically, as shown in FIG. 3B, the circuit chip 10 is mounted on and fixed to the island portion 31 through an adhesive 60. Also, the second surface 22 of the second end section 24 is bonded to the support portion 33 through the film 34. Thus, the sensor chip 20 is supported by the support portion 33.

Next, as shown in FIG. 3C, wire bonding is performed. Specifically, the circuit chip 10 is connected to the pads 26 of the sensor chip 20 and the lead portions 32 through the bonding wires 40, 41. Thus, the circuit chip 10 is electrically connected with the sensor chip 20 and the lead portions 32. In this way, the second process is finished.

As shown in FIGS. 4 and 5A to 5C, in the third process, the island portion 31, the circuit chip 10, the bonding wires 40, 41, and the first end section 23 are sealed with a resin. In this case, the second end section 24 supported on the support portion 33 is not sealed with the resin and is thus disposed outside of the molded resin 50.

Specifically, as shown in FIG. 4, the work piece shown in FIG. 2 is placed in the die 100. The die 100 is a general die, and includes an upper member and a lower member.

The die 100 has a cavity 101 with a shape corresponding to the outline of the molded resin 50. In the state where the work piece shown in FIG. 2 is placed in the die 100, the frame portion 35, the support portion 33 and parts of the lead portions 32 and the second end section 24 are tightly in contact with the die 100 outside of the cavity 101 while being pressed by the die 100.

Then, as shown in FIG. 5A, in the state where the second end section 24 is supported by the support portion 33, a molten resin is injected into the cavity 101 to seal the work piece disposed in the cavity 101, that is, to form the molded resin 50.

In this case, the support portion 33 and the second end section 24 are covered with the die 100 in a state of being tightly in contact with the die 100. Therefore, with regard to the sensor chip 20, only the first end section 23, which is not in contact with the support portion 33, is sealed with the molded resin 50.

Next, as shown in FIGS. 5B and 5C, the support portion 33 is cut from the lead frame 30, and the support portion 33 is separated from the second end section 24. Specifically, the tie bars 36 are cut in the lead frame 30, and the support portion 33 and the film 34 are removed with the frame portion 35. Thus, the island portion 31 and the lead portions 32 remain.

The support portion 33 is removed by separating the film 34 from the second surface 22 of the second end section 24. In this case, the film 34 is adhered with the sensor chip 20 with a predetermined adhesive strength so that the film 34 can be separated from the sensor chip 20.

For example, in a case where the film 34 is provided by the foamed resin, a contact area between the film 34 and the sensor chip 20 is relatively small due to small holes of a foamed structure. Therefore, the film 34 can be easily separated from the sensor chip 20. In a case where the film 34 is provided by the UV curable resin, the adhesive strength can be reduced by applying a UV light. Also in this case, the film 34 can be easily separated from the sensor chip 20.

After the third process described above, the sensor chip 20 is in a state where the first end section 23 is supported only by the molded resin 50, and the second end section 24 is located outside of the molded resin 50. In this way, the molded package S1 is produced.

In the manufacturing method according to the present embodiment, before the sealing with the resin, that is, before the resin-molding, the sensor chip 20, which is only electrically connected to the circuit chip 10 through the pads 26 and the bonding wires 40, is supported by the support portion 33 at the second end section 24. Therefore, the work piece is handled while restricting the sensor chip 20 from shaking or moving before the sealing with the resin. That is, the work piece can be handled while keeping the sensor chip 20 steady.

Further, in the second process of the manufacturing method, the second end section 24 and the support portion 33 are bonded to each other through the adhesive film 34. Therefore, the second end section 24 can be connected to the support portion 33 with the film 34 without having a clearance, and thus it is less likely that the sensor chip 20 will be displaced relative to the support portion 33.

In addition, in the second process, excluding the bonding wires 40, the sensor chip 20 is in contact with only the support portion 33 through the film 34, and is supported only by the support portion 33. Therefore, after the third process, the first end section 23 can be supported only by the molded resin 50.

Namely, since the sensor chip 20 is effectively supported by the support portion 3, it is not necessary to employ a configuration to support the first end section 23 before the sealing with the resin. After the sealing with the resin, the sensor chip 20 is supported only by the molded resin 50 at the first end section 23 as the first end section 23 is sealed within the molded resin 50. Namely, after the sealing with the resin, with regard to the sensor chip 20, only the first end section 23 is supported by the molded resin 50.

Figure 6:
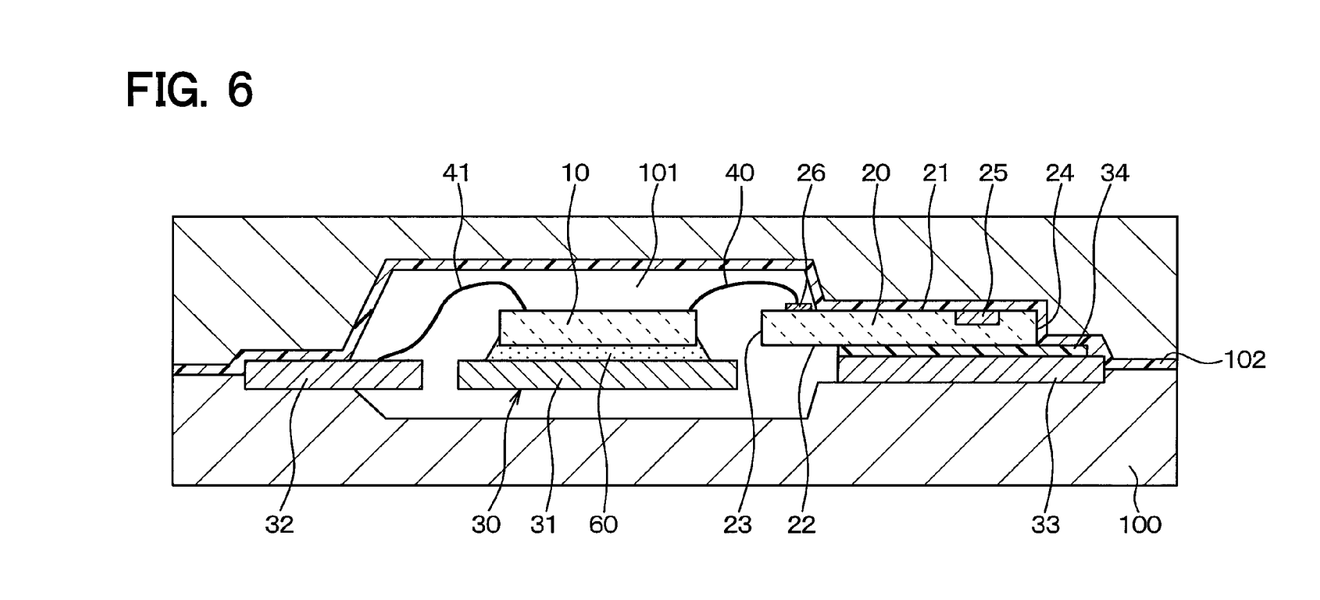
FIG. 6 is a diagram illustrating a schematic cross-sectional view of the lead frame disposed in a molding die for explaining another example of the third process of the manufacturing method of the molded package according to the first embodiment.

FIG. 6 is a diagram illustrating a schematic cross-sectional view of the work piece disposed in the molding die 100 for explaining another example of the manufacturing method.

As shown in FIG. 6, in the third process, a sealing film 102 may be disposed between the sensor chip 20 and the molding die 100 at least at a contact portion between the work piece and the molding die 100. The sealing film 102 has an adhesive property, and is for example made of a polyimide resin or an acrylic resin.

The sealing film 102 is attached to a portion of the molding die 100 where the molding die 100 is to be in contact with the work piece forming components of the molded package S1, that is, where the molding die 100 is to be in contact with the sensor chip 20, the support portion 33 and the lead portions 32. After the sealing film 102 is attached to the portion of the molding die 100, the work piece is disposed in the molding die 100 through the sealing film 102.

In the example shown in FIG. 6, the sealing film 102 is attached also to an inner surface of the cavity 101. However, it is not always necessary to attach the sealing film 102 to the portion where the molding die 100 does not contact the work piece.

In a case of employing the sealing film 102 as described above, in the sealing with the resin, the portion of the work piece, which faces the molding die 100, is tightly in contact with the sealing film 102 and is properly covered by the sealing film 102. Therefore, it is less likely that the resin will adhere to the portion of the work piece covered with the sealing film 102.

Second Embodiment

FIGS. 7A-7C and 8A-8C are diagrams illustrating schematic cross-sectional views of a work piece for explaining a manufacturing method of a molded package S2 according to a second embodiment. Hereinafter, structure or process different from those of the first embodiment will be mainly described.

Figure 7A:
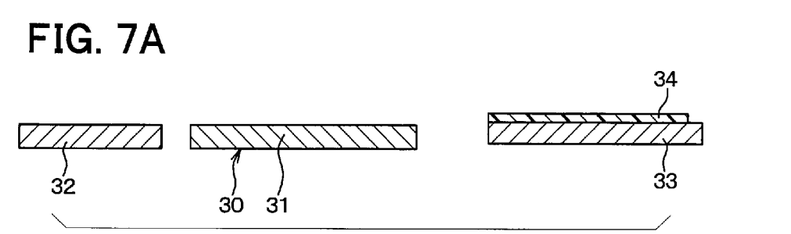
FIGS. 7A, 7B and 7C are diagrams illustrating schematic cross-sectional view of a work piece for explaining a manufacturing method of a molded package according to a second embodiment.
Figure 7B:
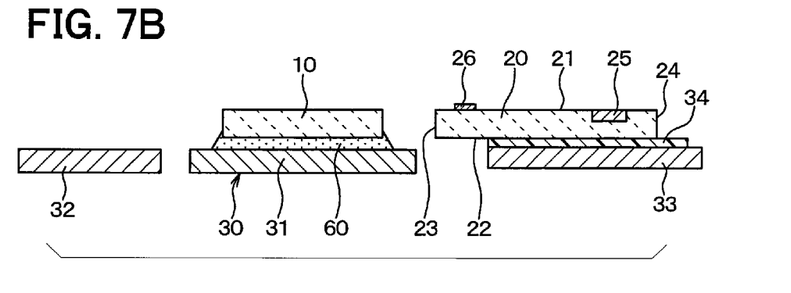
Figure 7C:
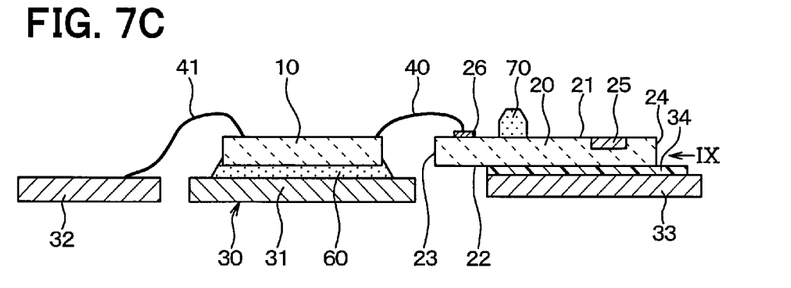
Figure 8A:
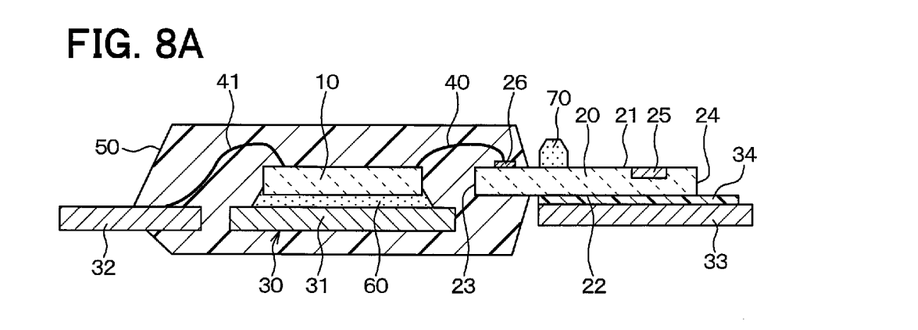
FIGS. 8A, 8B and 8C are diagrams illustrating schematic cross-sectional views of the work piece for explaining a process subsequent from the process shown in FIG. 7C.
Figure 8B:
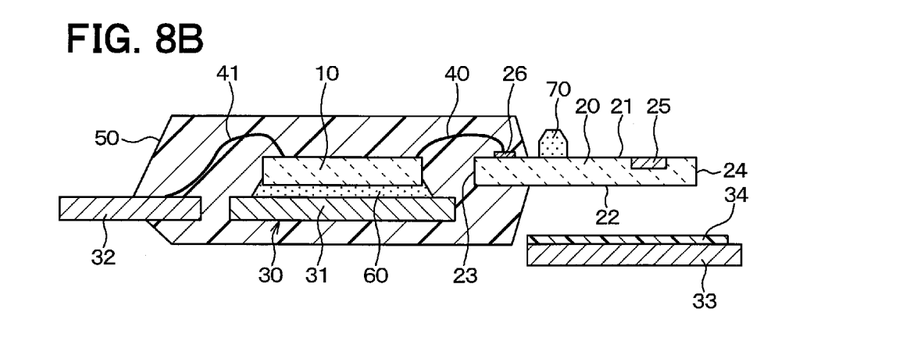
Figure 8C:
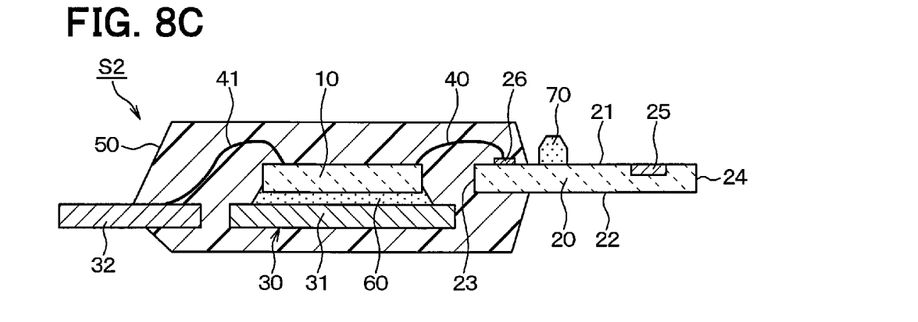

As shown in FIG. 7C, a resin stopper 70 is used in the second process for restricting projection or overflow of the resin. The resin stopper 70 is disposed on the sensor chip 20 between the first end section 23 and the second end section 24.

The resin stopper 70 restricts the resin for sealing the first end section 23 from overflowing from the first end section 23 and adhering to the second end section 24 in the third process.

Figure 9:
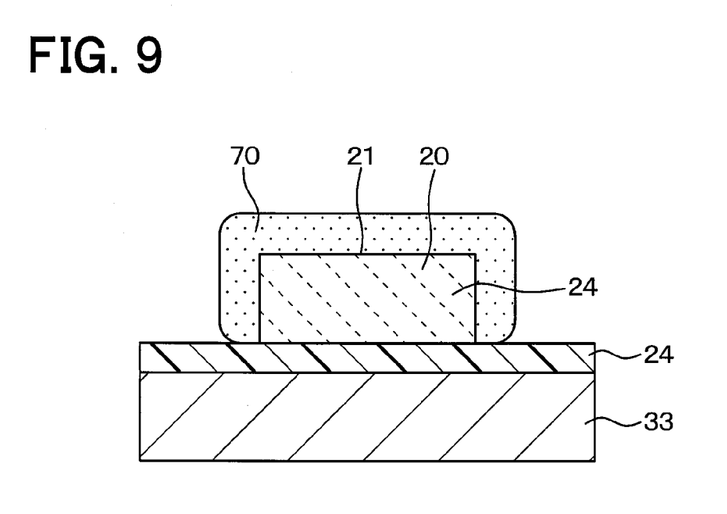
FIG. 9 is a diagram illustrating a side view of a sensor chip and a support portion when viewed along an arrow IX in FIG. 7C.

FIG. 9 is a diagram illustrating a side view of the sensor chip 20 and the support portion 33 when viewed along an arrow IX in FIG. 7C. For example, the resin stopper 70 is formed into a wall shape along the first surface 21 and side edge surfaces of the sensor chip 20. In other words, the resin stopper 70 is formed to project from the first surface 21 and the side edge surfaces of the sensor chip 20 between the first end section 23 and the second end section 24. For example, the resin stopper 70 is made of an epoxy resin, and is formed by a general technique such as depositing and hardening.

In the present embodiment, since the resin stopper 70 is formed on the sensor chip 20 before the third process, it is less likely that the resin will reach and adhere to the second end section 24 over the first end section 23 in the third process. The resin stopper 70 is disposed at least before the third process. For example, the resin stopper 70 may be formed on the sensor chip 20 before the sensor chip 20 is fixed to the lead frame 30.

Third Embodiment

Figure 10A:
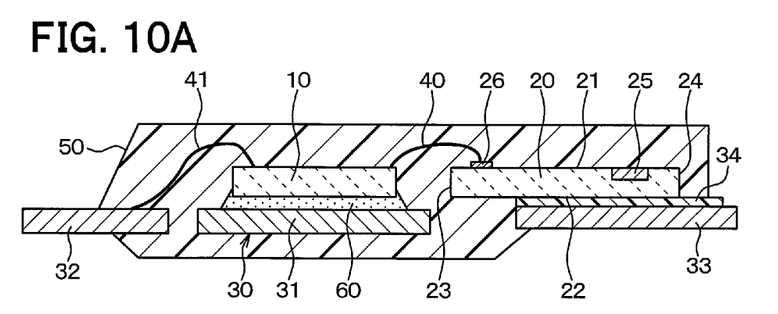
FIGS. 10A, 10B and 10C are diagrams illustrating schematic cross-sectional views of a work piece for explaining a process of a manufacturing method of a molded package according to the third embodiment.
Figure 10B:
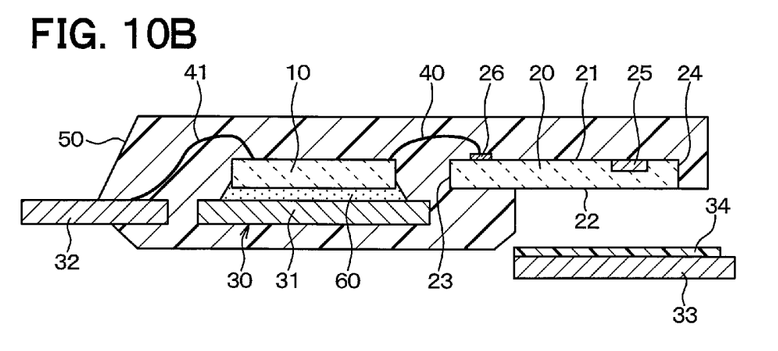
Figure 10C:
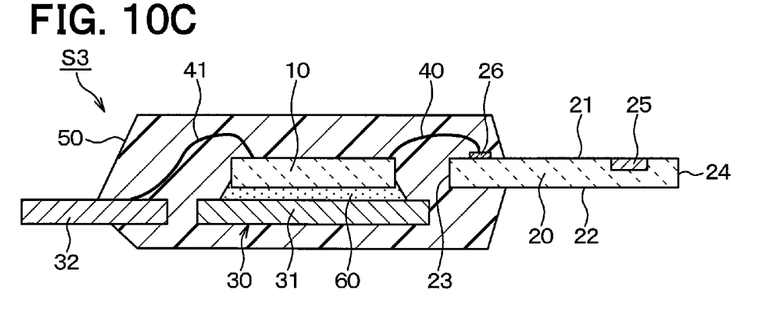

FIGS. 10A-10C are diagrams illustrating schematic cross-sectional views of a work piece for explaining a third process of a manufacturing method of a molded package S3 according to a third embodiment. Hereinafter, structure or process different from those of the first embodiment will be mainly described.

In the third process of the first embodiment, with regard to the sensor chip 20, only the first end section 23 is sealed in the molded resin 50. In the third process of the third embodiment, on the other hand, the sensor chip 20 is sealed so that the first surface 21 opposite to the second surface 22 supported by the support portion 33 is fully covered with the molded resin 50 from the first end section 23 to the second end section 24. Namely, the first surface 21 of the second end section 24 is also sealed with the molded resin 50 continuously from the first end section 23.

This configuration can be easily made by changing a shape of a part of the cavity 101. In the third process, after the sealing with the resin, the support portion 33 is cut from the lead frame 30 and is separated from the second end section 24 with the film 34, as shown in FIG. 10B.

After the support portion 33 is separated, as shown in FIG. 10C, a part of the molded resin 50 sealing the second end section 24 is removed. In this case, the molded resin 50 is removed such as by a laser incineration technique, an etching technique or a polishing technique.

In this way, in the third process, after the sealing with the resin, the part of the molded resin 50 is removed so that the second end section 24 is projected from the molded resin 50. Accordingly, the molded package S3 similar to the molded package S1 of the first embodiment can be produced.

In the manufacturing method of the present embodiment, a sealing area of the sensor chip 20 sealed with the molded resin 50 is larger than that of the first embodiment. Therefore, the sensor chip 20 is further stably held after the sealing with the resin and until the removing of the part of the molded resin 50. Namely, since the sensor chip 20 is stably fixed, the support portion 33 can be easily separated from the sensor chip 20.

Fourth Embodiment

Figure 11:
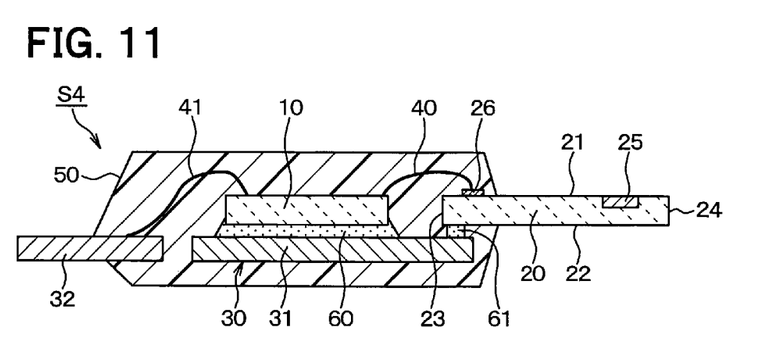
FIG. 11 is a diagram illustrating a schematic cross-sectional view of a molded package according to a fourth embodiment.

FIG. 11 is a diagram illustrating a schematic cross-sectional view of a molded package S4 according to the fourth embodiment.

In the manufacturing method of the first embodiment, the sensor chip 20 is supported only by the support portion 33, excluding the bonding wires 40, in the second process, and thus the sensor chip 20 is held in the molded package S1 so that only the first end section 23 is supported by the molded resin 50 after the third process.

In the present embodiment, on the other hand, the first end section 23 is supported by the island portion 31 through an adhesive 61, excluding the bonding wires 40, in the second process. The adhesive 61 is for example a resin adhesive or a solder.

Accordingly, after the third process, the first end section 23 is supported by the island portion 31 and the molded resin 50, as shown in FIG. 11. According to the manufacturing method of the present embodiment, the sensor chip 20 is further stably held before the sealing with the resin.

In the present embodiment, the first end section 23 is additionally supported on the island portion 31 through the adhesive 61 with regard to the manufacturing method of the first embodiment. Therefore, the manufacturing method of the present embodiment can be combined with the manufacturing method of the second embodiment or the third embodiment.

Fifth Embodiment

Figure 12A:
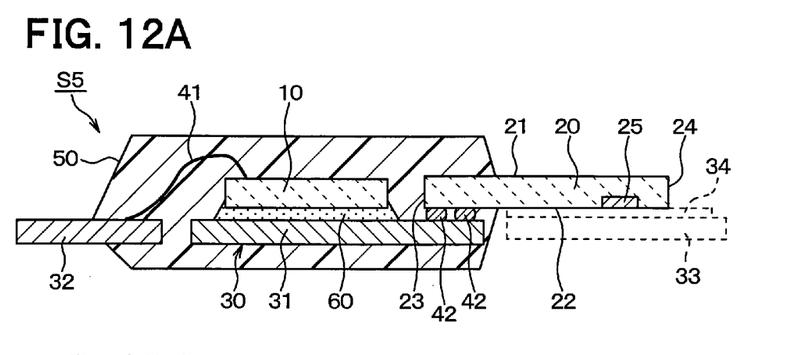
FIG. 12A is a diagram illustrating a schematic cross-sectional view of an example of a molded package according to a fifth embodiment.
Figure 12B:
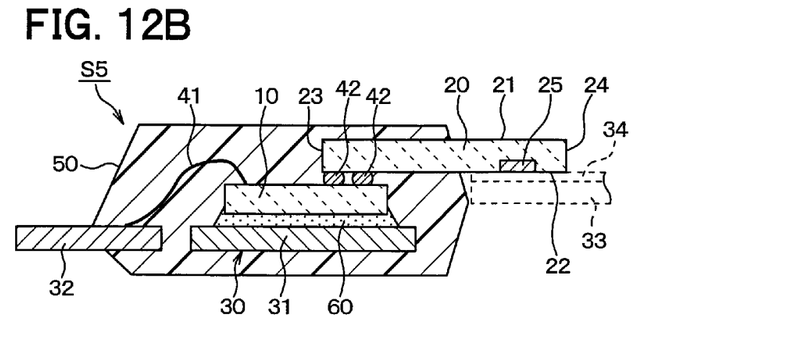
FIG. 12B is a diagram illustrating a schematic cross-sectional view of another example of the molded package according to the fifth embodiment.

FIGS. 12A and 12B are diagrams illustrating schematic cross-sectional views of a first example and a second example of a molded package S5 according to the fifth embodiment.

In FIGS. 12A and 12B, the molded package S5 after the third process is illustrated. Therefore, the support portion 33 of the lead frame 30 and the film 34, which are used during the manufacturing process, are illustrated by dashed lines. During the manufacturing process, the second end section 24 is supported by the support portion 33 as shown by the dashed lines.

In the first embodiment, as the connection member for electrically connecting between the pads 26 of the sensor chip 20 and the circuit chip 10, the bonding wires 40 are used. Alternatively, as shown in FIGS. 12A and 12B, bumps 42 made of a solder, gold, copper or the like can be used as the connection member.

In this case, the sensing portion 25 and the pads 26 are disposed on the second surface 22 of the sensor chip 20.

Further, in the first example shown in FIG. 12A, the second surface 22 of the first end section 23 is opposed to the island portion 31, and the pads 26 and the island portion 31 are electrically connected to each other through the bumps 42. As such, the sensor chip 20 is electrically connected to the circuit chip 10 through the bumps 42 and the island portion 31.

In the second example shown in FIG. 12B, the second surface 22 of the first end section 23 is opposed to the circuit chip 10, and the pads 26 and the circuit chip 10 are electrically connected to each other through the bumps 42.

In the manufacturing method of the present embodiment, the sensor chip 20 is connected to the island portion 31 through the bumps 42 in the above-described second process, and the above-described third process is performed while supporting the second end section 24 by the support portion 33. In this way, the molded package S5 is manufactured.

Accordingly, also in the present embodiment, the sensor chip 20 is stably held before the sealing with the resin. That is, the handling property of the work piece improves as the sensor chip 20 is held steady.

In the present embodiment, the bumps 42 are used as the connection member in place of the bonding wires 40 of the first embodiment. Therefore, the present embodiment can be combined with any of the second through fourth embodiments.

Sixth Embodiment

Figure 13:
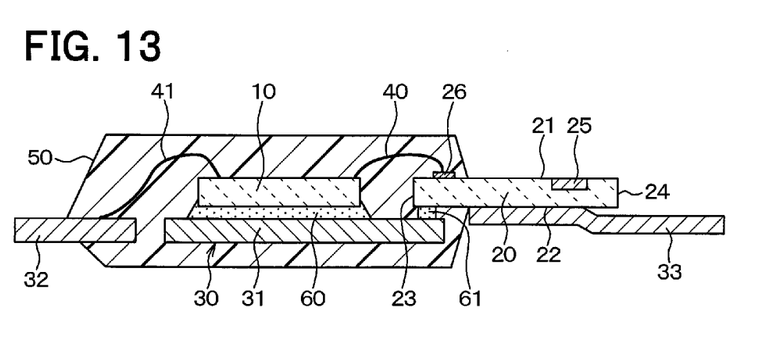
FIG. 13 is a diagram illustrating a schematic cross-sectional view of a molded package for explaining a process of a manufacturing method of the molded package according to a sixth embodiment.

FIG. 13 is a diagram illustrating a schematic cross-sectional view of a work piece for explaining a third process of a manufacturing method of a molded package S6 according to the sixth embodiment. In this case, the support portion 33 is formed by a depression working so that the support portion 33 comes close to the sensor chip 20.

Because the height of the support portion 33 can be adjusted by the depression working, a relative position between the circuit chip 10 and the sensor chip 20 in a height direction, such as in an up and down direction in FIG. 13, can be easily adjusted. For example, in a case where a distance between the sensor chip 20 and the circuit chip 10 is relatively large in the height direction as shown in FIG. 12B, the support portion 33 formed by the depression working can be effectively used.

In FIG. 13, although the film 34 is not illustrated, the support portion 33 may support the second end section 24 through the film 34 similar to the above described embodiment.

Other Embodiments

Figure 14:
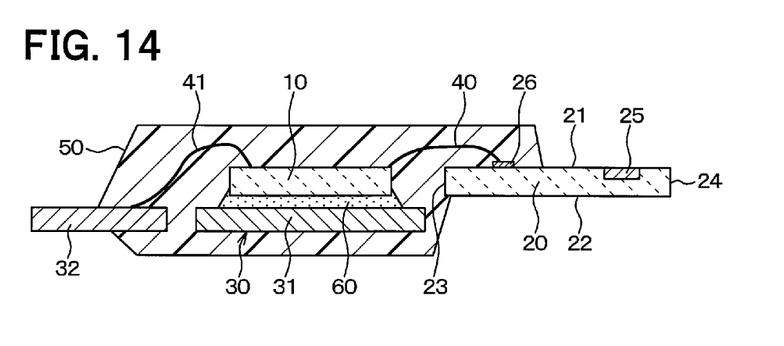
FIG. 14 is a diagram illustrating a schematic cross-sectional view of a molded package according to another embodiment.
Figure 15:
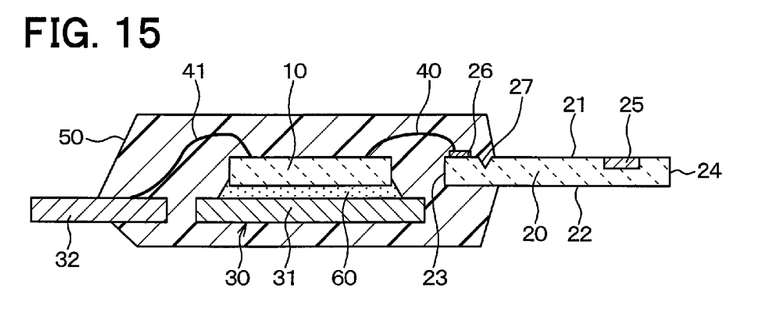
FIG. 15 is a diagram illustrating a schematic cross-sectional view of a molded package according to further another embodiment.

FIGS. 14 and 15 are diagrams illustrating schematic cross-sectional views of molded packages as other embodiments.

As shown in FIG. 14, in the third process, the first end section 23 is sealed with the molded resin 50 only on the first surface 21 so that the second surface 22 of the first end section 23 is exposed. This configuration can be achieved by changing the shape of the cavity 101 of the molding die 100. In this case, the pads 26 are disposed on the first surface 21 of the first end section 23, and connected to the circuit chip 10 through the bonding wires 40 at a side of the first surface 21. Therefore, the first surface 21 of the first end section 23 needs to be sealed with the molded resin 50.

As shown in FIG. 15, the sensor chip 20 may have a groove 27 on the first surface 21 in the first end section 23 to improve sealing tightness with the molded resin 50. Namely, the molded resin 50 is filled in the groove 27 to engage with the sensor chip 20. In this case, the sensor chip 20 having the groove 27 is prepared in the first process, for example. The groove 27 may be formed beforehand by etching or cutting, for example.

In the above described manufacturing methods, the second end section 24 is bonded to the support portion 33 through the adhesive film 34 in the second process. Alternatively, the adhesive film 34 can be eliminated, if possible. Namely, the second end section 24 may be directly in contact with the support portion 33 to be supported by the support portion 33.

As the electric connecting portions, terminals attached to the sensor chip 20 may be used, in addition to or alternative to the pads 26. The terminals are for example provided by metal plates or the like. As the connection member, plate-shaped lead members and the like may be used, in addition to or alternative to the bonding wires 40 and bumps 42. In this case, the lead members may be connected to conductive adhesive or the like.

The island portion 31 is typically used for disposing the circuit chip 10 thereon. In addition to this, various electronic components such as passive components may be mounted on the island portion 31 and sealed with the molded resin 50.

While only the selected exemplary embodiments have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiments according to the present disclosure is provided for illustration only, and not for the purpose of limiting the disclosure as defined by the appended claims and their equivalents.

What is claimed is:

1. A method of manufacturing a molded package, the method comprising:
preparing a circuit chip, a sensor chip and a lead frame, the sensor chip having an electric connecting portion at a first end section thereof and a sensing portion at a second end section thereof, the lead frame having an island portion and a support portion;
mounting the circuit chip on the island portion;
arranging the sensor chip so that the first end section is positioned adjacent to the circuit chip and the second end section is supported by the support portion;
electrically connecting the electric connecting portion and the circuit chip through a connection member so that the second end section is supported by the support portion;
sealing the island portion, the circuit chip, the connection member and the first end section with a resin, after the electrically connecting, while maintaining the second end section being supported by the support portion;
cutting the support portion from the lead frame after the sealing; and
separating the support portion from the second end section.

2. The method according to claim 1, wherein
in the sealing, with regard to the sensor chip, only the first end section is sealed with the resin.

3. The method according to claim 2, further comprising:
forming a resin stopper on the sensor chip between the first end section and the second end section, before the sealing, to restrict the resin from overflowing toward the second end section during the sealing.

4. The method according to claim 1, wherein
in the sealing, a surface of the second end section opposite to the support portion is also sealed with the resin continuously from the first end section, the method further comprising:

removing the resin from the surface of the second end section, after the separating, so that the second end section is disposed outside of a molded resin.

5. The method according to claim 1, wherein
in the electrically connecting, the sensor chip is in contact with only the support portion and supported only by the support portion, excluding the connection member; and
after the separating, the first end section of the sensor chip is supported only by the resin.

6. The method according to claim 1, wherein the arranging further includes adhering the first end section to the island portion through an adhesive so that the first end section is supported by the island portion.

7. The method according to claim 1, wherein the arranging further includes adhering the second end section to the support portion through an adhesive film.

8. The method according to claim 1, wherein the connection member includes a bonding wire.

9. The method according to claim 1, wherein the connecting member includes a bump.

10. A method of manufacturing a molded package, the method comprising:
mounting a circuit chip onto an island portion;
temporarily mounting a sensor chip onto a support portion that is adjacent to the island portion;
forming electrical connections among a lead portion that is adjacent to the island portion, the circuit chip, and the sensor chip;
completely sealing the circuit chip and the island portion in a resin;
partially sealing respective sections of the lead portion and the sensor chip closest to the island portion in the resin; and
removing the support portion from the sensor chip so that only the resin that partially seals the section of the sensor chip closest to the island portion supports the sensor chip.

11. The method according to claim 10, wherein the completely sealing the circuit chip and the island portion and the partially sealing respective sections of the lead portion and the sensor chip closest to the island portion in the resin occur simultaneously and result in sealing of the electrical connections.

12. The method according to claim 10, wherein the removing of the support portion further comprises removing an adhesive film that connects the support portion to the sensor chip.

13. A method of manufacturing a molded package, the method comprising:
mounting a circuit chip onto an island portion of a lead frame;
temporarily mounting a sensor chip onto a support portion that includes a plurality of tie bars connecting the support portion to the island portion;
forming electrical connections among a lead portion adjacent to the island portion, the circuit chip, and the sensor chip;
completely sealing the circuit chip and the island portion in a resin;
partially sealing respective sections of the lead portion and the sensor chip closest to the island portion in the resin; and
removing the support portion from the sensor chip by cutting the plurality of tie bars so that only the resin that partially seals the section of the sensor chip closest to the island portion supports the sensor chip.

14. The method according to claim 13, wherein the completely sealing the circuit chip and the island portion and the partially sealing respective sections of the lead portion and the sensor chip closest to the island portion in the resin occur simultaneously and result in sealing of the electrical connections.

15. The method according to claim 13, wherein the removing of the support portion further comprises removing an adhesive film that connects the support portion to the sensor chip.

* * * * *